United States Patent [19]
Masak

[11] Patent Number: 4,641,141
[45] Date of Patent: Feb. 3, 1987

[54] COHERENT DUAL AUTOMATIC GAIN CONTROL SYSTEM

[75] Inventor: Raymond J. Masak, East Northport, N.Y.

[73] Assignee: The United States of America as represented by the Secretary of the Air Force, Washington, D.C.

[21] Appl. No.: 623,289

[22] Filed: May 2, 1984

[51] Int. Cl.⁴ .............................................. G01S 3/16
[52] U.S. Cl. .................................... 342/379; 455/136
[58] Field of Search ................... 343/7 AG, 378–384; 455/136, 138, 232, 234, 245, 246, 247

[56] References Cited

U.S. PATENT DOCUMENTS

| | | | |
|---|---|---|---|
| 2,903,577 | 9/1959 | Adams | 455/138 |
| 4,177,464 | 12/1979 | Masak | 343/380 |
| 4,241,351 | 12/1980 | Shreve | 343/100 SA |
| 4,246,585 | 1/1981 | Mailloux | 343/854 |
| 4,268,829 | 5/1981 | Baurle et al. | 343/100 LE |
| 4,274,148 | 6/1981 | Hullenaar | 367/122 |
| 4,280,128 | 7/1981 | Masak | 343/100 LE |
| 4,313,116 | 1/1982 | Powell et al. | 343/383 |
| 4,367,472 | 1/1983 | Hauptmann et al. | 343/383 |

Primary Examiner—Theodore M. Blum
Assistant Examiner—David Cain
Attorney, Agent, or Firm—Willard R. Matthews; Donald J. Singer

[57] ABSTRACT

Improved gain control in a multiplexed adaptive array processor having main and a reference channel receiver is achieved by means of an AGC circuit controlling the gain of the reference channel receiver over its dynamic range, an AGC circuit slaved to the reference channel receiver AGC circuit controlling the main channel receiver, and a separate AGC circuit controlling the output of the main channel receiver.

1 Claim, 7 Drawing Figures

4,641,141

COHERENT DUAL AUTOMATIC GAIN CONTROL SYSTEM

STATEMENT OF GOVERNMENT INTEREST

The invention described herein may be manufactured and used by or for the Government for governmental purposes without the payment of any royalty thereon.

BACKGROUND OF THE INVENTION

This invention relates to a multiplexed adaptive array and array processor for use in high frequency communications systems and in particular to a coherent dual automatic gain control circuit that maintains stable adaptive loop gain at all signal input levels.

Communication channels in the HF band are susceptible to various types of interference. This interference can either be deliberate jamming or another undesired signal transmission. The applicability of adaptive processing techniques to HF sidelobe cancellation as a means for obviating the effect of such interference has been investigated experimentally. It has been determined, in order configure an HF adaptive sidelobe canceller that meets military requirements, several key problems must be resolved. One such problem involves the desired signal discriminant. That is, a method that must be employed to prevent the array controller from nulling the desired signal. In the HF band, many sources of interference are indistinguishable from the desired signal on a time and/or frequency basis.

A second problem relates to the use of multiple loops in a dense signal/interference environment. Techniques must be used to bandlimit the operation of the array controller to the particular channel-frequency of interest. If bandlimiting is not employed, the degrees of freedom associated with the adaptive array may be used up on essentially harmless out-of-channel interferers. The bandlimiting approach selected must be capable of supplying the proper error signals to a set of multiple array weights so that the processing capability of the array can be totally and efficiently used.

A further problem relates to dynamic range performances. Both signals and interferers in the HF band can normally possess dynamic ranges in excess of 100 dB. A requirement for controller operation must be defined for performance over the expected power levels.

Finally, there is the problem of processed contrast ratio. It is assumed that no processing gain is available for the desired signal. The controller itself must operate to supply a processed S/J ratio which is adequate fo extracting the required information.

Although these problems can be addressed and resolved to a degree by state of the art radar technology, excessively complex hardware implementations are generally required. This is particularly true of conventional multiplexed adaptive antenna techniques that utilize signals from all elements simultaneously. This deficiency has been overcome by providing a system in which one reference receiver and multiplexed correlator perform an equivalent function of the multiple receiver used in the conventional system. This system is described in my co-pending patent application, Ser. No. 623,288 entitled Multiplexed Adaptive Array System, filed on even date herewith.

The prior art systems and the system described in my co-pending patent application operate in a wide dynamic range environment and require an automatic gain control (AGC) system that will maintain a stable, adaptive loop gain at all signal input levels. Conventional AGC systems have not been effective in accomplishing this. The present invention is directed toward providing an AGC circuit that will solve this problem and provide constant gain over the entire cancellation range.

SUMMARY OF THE INVENTION

The coherent dual automatic gain control arrangement of the invention finds utilization in multiplexed adaptive array systems that operate in a wide dynamic range environment. Such systems require an automatic gain control (AGC) system in their reference and main channel receiver paths in order to maintain a stable adaptive loop gain at all signal input levels. In order to accomplish this, it is necessary that the main channel receiver (feedback path of the adaptive control system) have constant gain over the cancellation range. In the invention an AGC voltage developed in the reference channel receiver is applied to the main channel receiver and sets its gain to the same value as the reference channel. When interference is present larger than the desired signal, the output of the main channel varies but the reference channel receiver does not respond to this variation. In order to restore the desired signal level to that required for normal listening a second independent AGC is used at the main channel receiver output which automatically maintains constant level output to the speaker terminals.

It is a principal object of the invention to provide a new and improved coherent dual automatic gain control circuit for use in an adaptive antenna array system.

It is another object of the invention to provide a coherent dual automatic gain control circuit for an adaptive antenna array system that will have constant gain over the entire cancellation range.

It is another object of the invention to provide a coherent dual automatic gain control circuit for an adaptive antenna array that will maintain a stable adaptive loop gain at all signal input levels.

These, together with other objects, features and advantages of the invention will become more readily apparent from the following detailed description when taken in conjunction with the illustrative embodiment in the accompanying drawings.

DESCRIPTION OF THE DRAWINGS

FIG. 5 is a schematic diagram of the demultiplexer and integration network of the HF adaptive canceller of FIG. 2;

FIG. 6 illustrates the timing wave form and timing control selectivity of the HF adaptive canceller of FIG. 2; and FIG. 7 is a schematic diagram of the circuits relevant to the invention.

DETAILED DESCRIPTION OF THE PREFERRED EMBODIMENT

The invention relates to an array processor for use in an HF adaptive canceller and particularly to an automatic gain control circuit that will maintain stable adaptive loop gain at all signal input levels.

Figure 1:
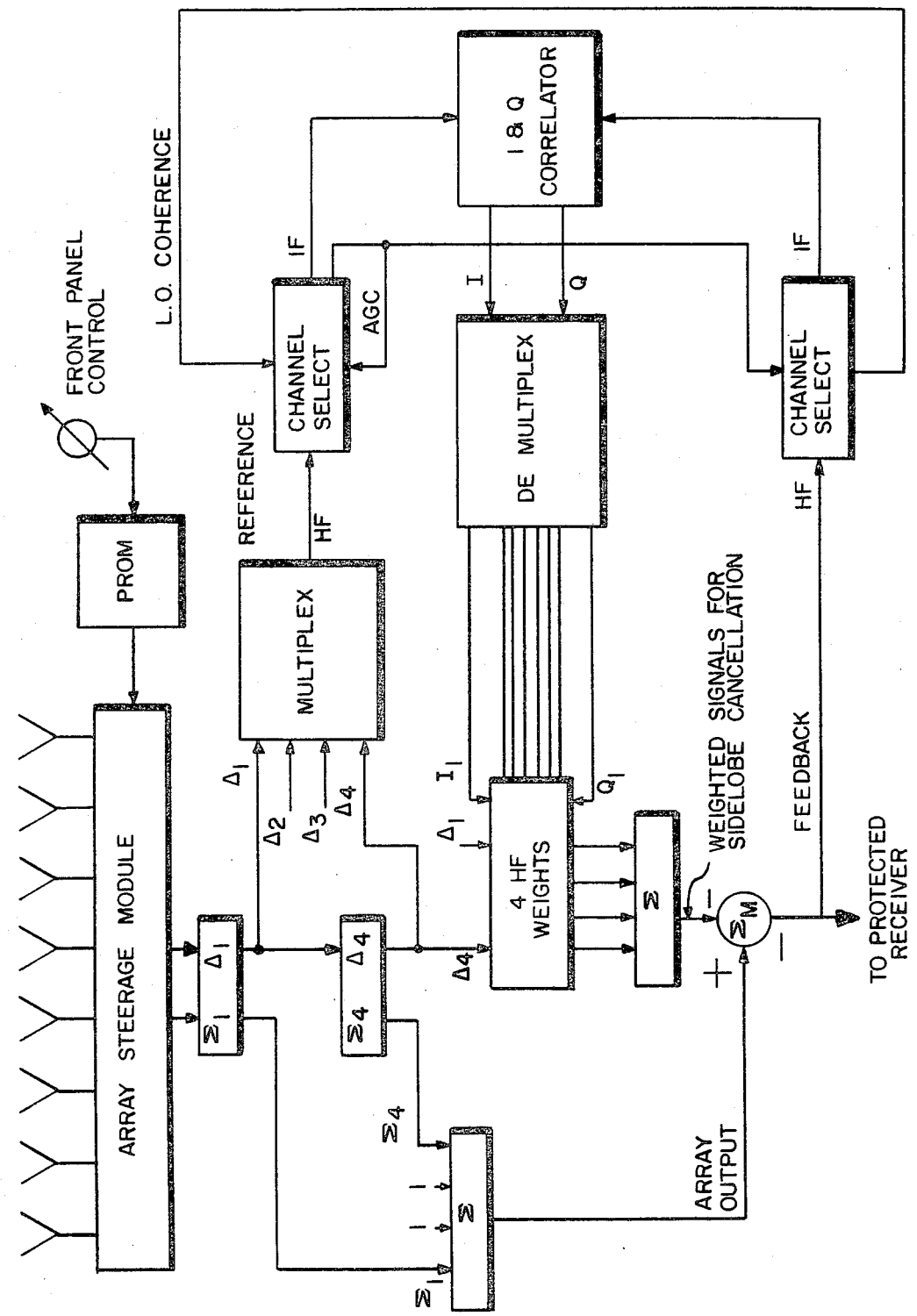
FIG. 1 is a simplified block diagram of an HF adaptive canceller incorporating the invention.

A simplified block diagram of the type of HF adaptive canceller to which the invention pertains is shown in FIG. 1. In the canceller of FIG. 1 a steerable eight element HF array is used in conjunction with four adaptively controlled weighting networks. The weight operates to cancel interference signals in the sidelobe structure of the array outputs. Direction of arrival (DOA) of the desired signal is used as the signal discriminant.

Bounds on the magnitudes of the weighted auxiliary channel signals prevent cancellation of the desired waveform in the array output. The array steerage circuits and weighting networks are all wideband covering the entire frequency range. The steerage angle of the array is slaved to a front panel control which strobes out the required phase progressions across the array from the addressed locations within a programmable read-only memory (PROM).

Reference and feedback channel selectors are used to band-limit controller operation to the frequency-channel of interest. The selector functions are implemented with two coherent R390A/URR receivers. Multiplexing techniques are used within the reference channel to permit independent control of the four HF weighting networks. A continuous feedback signal is generated after cancellation with the array output at the hybrid labeled $\Sigma_M$. The inputs to the channel selectors can be anywhere within the HF band. When tuned to a particular channel, they produce a bandlimited IF output at 455 kHz. These signals are then synchronously detected down to baseband, generating I and Q produce signals which are demultiplexed and independently integrated before being applied to the HF weighting circuits.

A slayed-AGC approach is used to handle the wide dynamic range requirements of the HF band. The reference channel R390 receiver is allowed to self-AGC. The gain of the feedback channel R390 is slaved to the AGC voltage of the reference channel unit. The feedback receiver operates as a voltage controlled linear amplifier whose gain is inversely proportional to the interference intensity at the output of the multiplexer. With this approach, a constant value of interference cancellation can be designed for and achieved over the entire input dynamic range.

Difference port subarray excitations are selected to minimize effects on the desired signal and improve the contrast ratio performance of the processor. The array steerage module is composed of eight phase shifters. When the array is steered to an angle at which a desired signal exists, the phases of the signal components at the outputs of the phase shifters are equal. Four $\Sigma/\Delta$ hybrids are used as a subarray processor at the output of the steerage module. The four $\Sigma$ port signals ($\Sigma_1, \Sigma_2, \Sigma_3, \Sigma_4$) are again summed to form the array output. The four port signals ($\Delta_1, \Delta_2, \Delta_3, \Delta_4$) are used to drive both the reference channel multiplexer and the four HF weights.

These $\Delta$ port signals theoretically contain no signal components since, by assumption, the array is steered to the DOA of the signal. The array output is, however, at a peak in the DOA of the signal. When cancellation at $\Sigma M$ occurs, the effects on the desired signal are minimal because of the absence of any signal components at the outputs of the weights.

Figure 2:
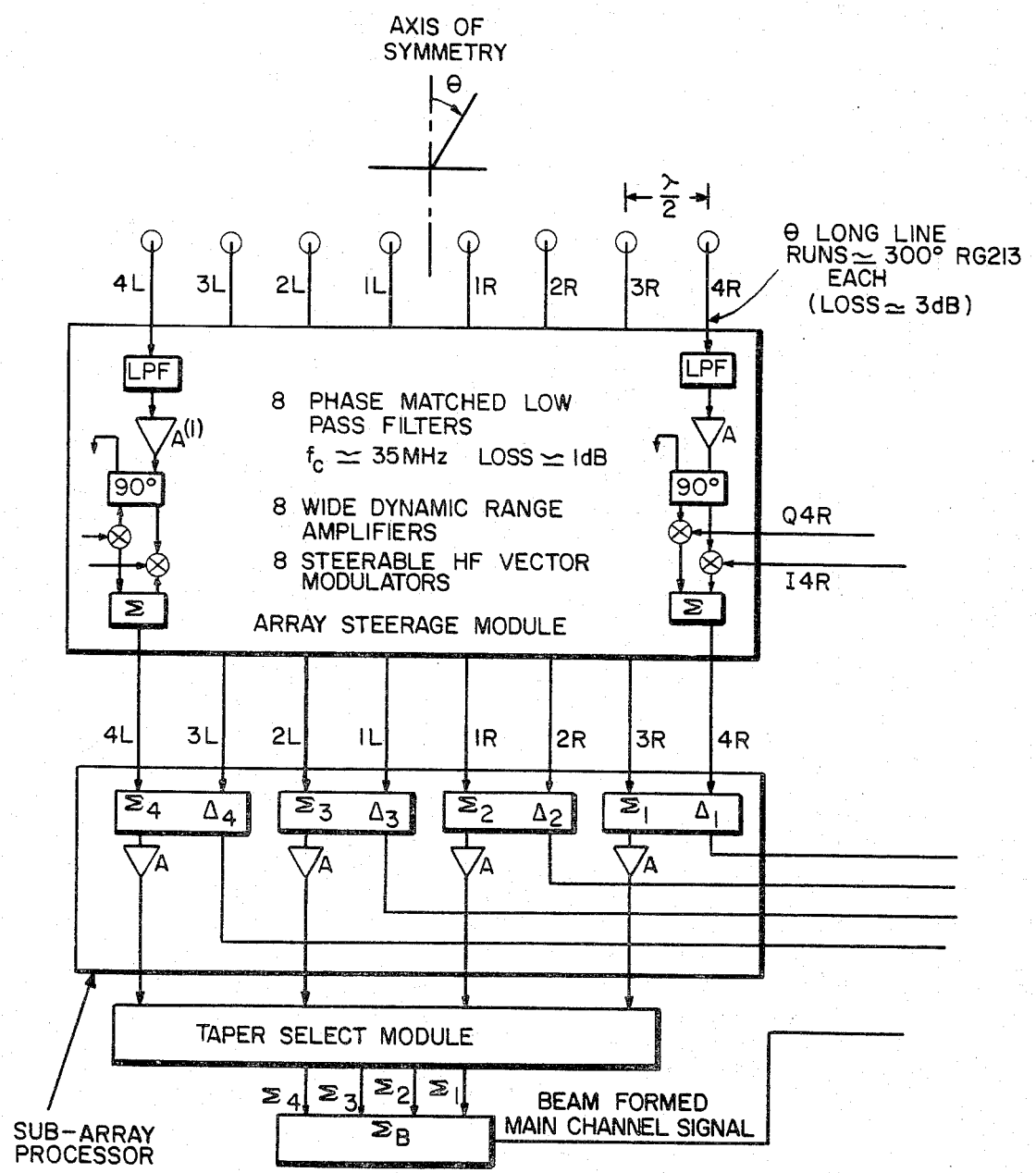
FIG. 2 is a detailed block diagram of the HF adaptive canceller of FIG. 1.
Figure 2:
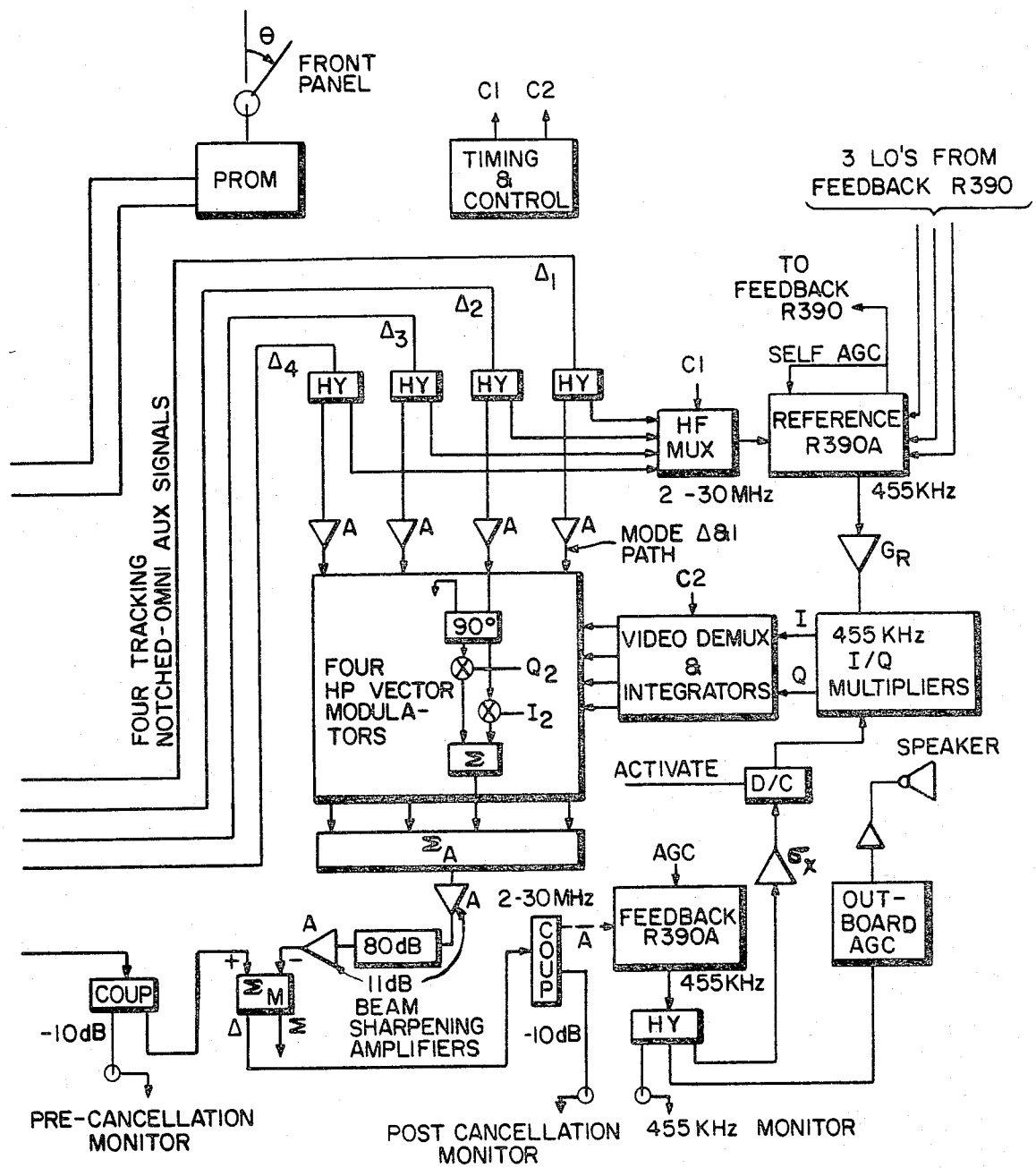

Referring now to FIG. 2, there is shown thereby a block diagram of the signal flow in the entire system.

The system is driven by a set of eight base-fed vertical whips labeled from left (L) to right (R) as (4L, 3L, ... 3R, 4R).

The array steerage module is comprised of eight identical parallel channels. Each channel is composed of low pass filter (LPF), an amplifier (A), and a steerable HF vector modulator. A four-pole LPF is used with a cutoff frequency of 35 MHz to suppress any local EMI above the HF band. The amplifier A has a gain of 10 dB and a noise figure of about 6 dB. Each filter and amplifier pair is phase matched to within $\pm°$ across the HF band. The amplifier used (ANZACAM-109) was selected because of its high (+48 d5m) third order intercept point, and its repeatably flat amplitude and time delay response across the HF band. The eight steerable vector modulator phase shifters are used as a set of weights to supply the required phase progressions for beam steering to the desired DOA direction. The steerage weights are controlled by a PROM which is strobed out under the command of a front panel steerage control potentiometer.

The subarray processor of FIG. 2 is composed of four HF $\Sigma/\Delta$ hybrids and four type A amplifiers. The amplifiers are placed at the four $\Sigma$ port outputs. The outputs of the amplifiers are fed to the taper-select module while the four difference port signals are fed to the remaining portions of the adaptive processor. The four $\Sigma/\Delta$ hybrids are driven by adjacent pairs of outputs from the array steerage module (4L, 3L; 2L, 1L; 1R, 2R; 3R, 4R). For the DOA direction, the coherent summation of in-phase signals occurs at each $\Sigma$ port output, while the coherent subtraction of the same in-phase signals occurs at each $\Sigma$ port output. Alternately, all $\Sigma$ port outputs are all relative maximums while all $\Delta$ port outputs are at relative minimums for the DOA direction.

The taper-select module can be manually switched in or out. When it is out, the four $\Sigma$ port outputs of the subarray processor are coherently added by hybrid $\Sigma_B$ to supply the beam-formed main channel signal. When the ($\frac{1}{2}$, 1, 1, $\frac{1}{2}$) taper is used, the outputs of $\Sigma_1$ and $\Sigma_4$ are each attenuated by 6 dB before being added to the signals from $\Sigma_2$ and $\Sigma_3$. A directional coupler is used to sample the beam-formed signal from the array (pre-cancellation monitor). The output of the coupler drives the main channel cancellation node $\Sigma_M$. It is here where the weighted auxiliary channel signals are subtracted to perform cancellation in the sidelobe structure of the array response.

The four difference port signals ($\Delta_1, \ldots 4$) are each divided in a hybrid. One set of four hybrid outputs drive the HF multiplexer while the other set of outputs are amplified by four type A amplifiers before driving the four adaptively controlled HF vector modulators. A nominal insertion loss of 10 dB is allowed for each vector modulator. The 10 db of gain supplied by amplifier A compensates for the nominal weight loss. The weighted outputs of the vector modulators are summed in hybrid $\Sigma_A$.

The output of $\Sigma_A$ is fed to the beam sharpening amplifiers which permit manual adjustment of the relative signal levels from $\Sigma_A$ with respect to the main channel beam-formed signal driving the cancellation node $\Sigma_M$. Two type A amplifiers are used (+20 dB) in combination with a pair of front panel attenuators. The total attenuation range is 20 dB. With a nominal setting of 11 dB, a net gain of 9 dB within the beam sharpening amplifiers occurs, permitting only cancellation of sidelobe signals within the beam formed pattern. The measured sidelobe levels of the array steerage module are about −12 dB. With increasing amounts of attenuation removed, the weighted auxiliary channel signals can be placed as close as 1 dB away from the peak of the beam-formed pattern, permitting beam-sharpened closed loop oeration of the processor.

The output of the cancellation node is sampled by a direction coupler (post-cancellation monitor). The output of the coupler drives the feedback R390 receiver, beginning the process of closed loop algorithm operation. The current controlled attenuators used in both the steerage module and the adaptively controlled weights have two-tone intercept points of about +15 dBm.

The adaptive controller is bandlimited to the channel of interest by using the two R390 receivers. The difference port signals ($\Delta_1, \ldots, \Delta_4$) are multiplexed into the reference channel R390 receiver. The multiplexed 455 kHz output is used as the reference signal for a set of I/Q multipliers which beams the correlation process. The function $G_R$ in FIG. 2 is amplification at 455 kHz to supply the necessary reference signal levels at the input to the 455 kHz correlation multipliers.

The continuous signal at the 455 kHz output of the feedback receiver is the other input to the 455 correlation (I/Q) multipliers. The multiplexed I/Q video outputs of the multipliers drive the demultiplexing and integration networks, which sample and individually integrate the eight control signals for the four adaptively controlled HF vector modulators.

The feedback receiver also suplies a 455 kHz monitoring point and a drive signal for an outboard AGC circuit. This AGC circuit drives an audio amplifier and a built-in speaker which is useful for obtaining qualitative performance improvement measures.

The reference receiver is allowed to self-AGC over the entire dynamic range. The reference AGC voltage is used to control the gain of the feedback R390 receiver. This technuqie permits operation with a constant cancellation ratio over the entire dynamic range. The local oscillators of the reference channel receiver are slaved to the oscillators of the feedback receiver. Since the algorithm operates on a correlation basis, coherence of both the reference and feed-back signals is required to prevent the control loop from loging lock.

The multiplexer of the above described system is used to sequentially sample the four $\Delta$ port excitations from the subarray processor.

Figure 3:
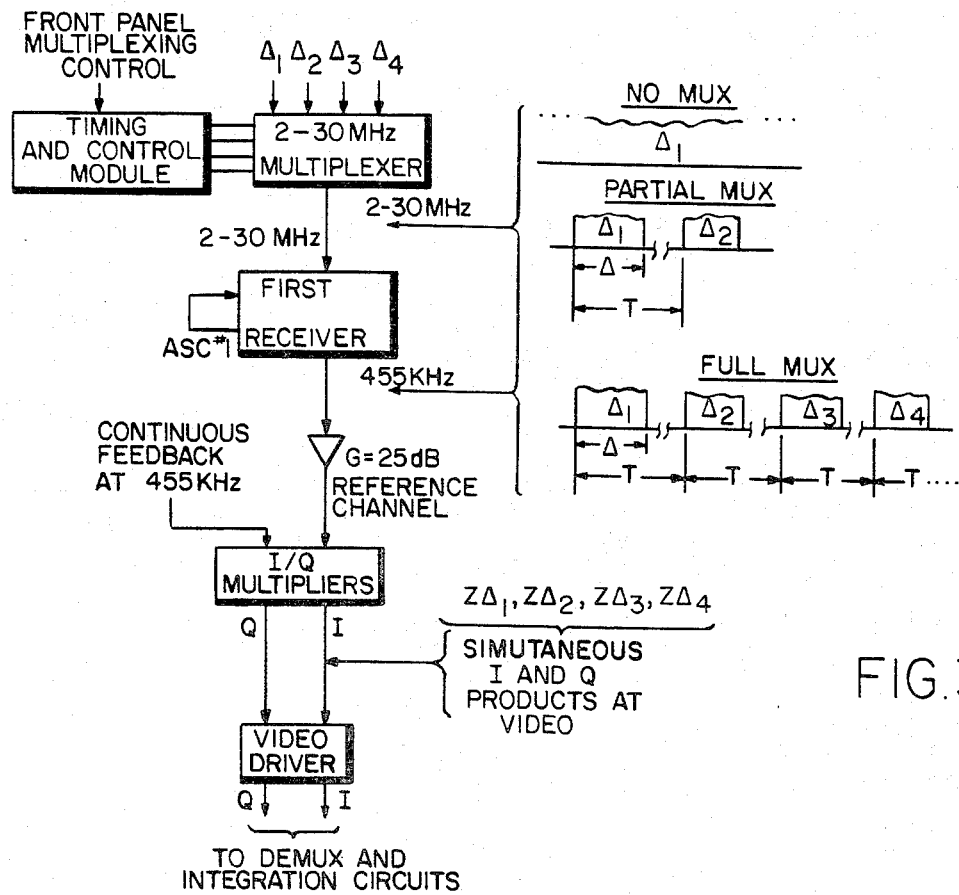
FIG. 3 is a schematic diagram of the multiplexing function of the HF adaptive canceller of FIG. 2.

This function is implemented by a set of four high-level, (+17 dBm) double balanced mixers driving a four way summing hybrid. The output of the hybrid is connected to the reference channel receiver. Parallel amplifiers are used to make up for the added insertion loss. The switching times of the mixers are slowed down by RC filtering the logic signals from the digital timing and control module. FIG. 3 contains a block diagram describing the inter-relationship between the multiplexed and the reference channel receiver. The waveforms for the various modes are also shown.

The 455 kHz output of the first or reference channel receiver is internally AGC'd to a level of about −15 dBm. This multiplexed signal is then amplified by 25 dB generating a 10 dBm input to the I/Q multipliers shown in FIG. 3. The AGC function of this first receiver is permitted to operate over the full normal input dynamic range. The other input to the I/Q multipliers of FIG. 3 is essentially the other 455 kHz output from the second R-390 receiver. Its AGC function is, however, slaved to the reference channel receiver before forming the continuous feedback signal to the I/Q multipliers.

Figure 4:
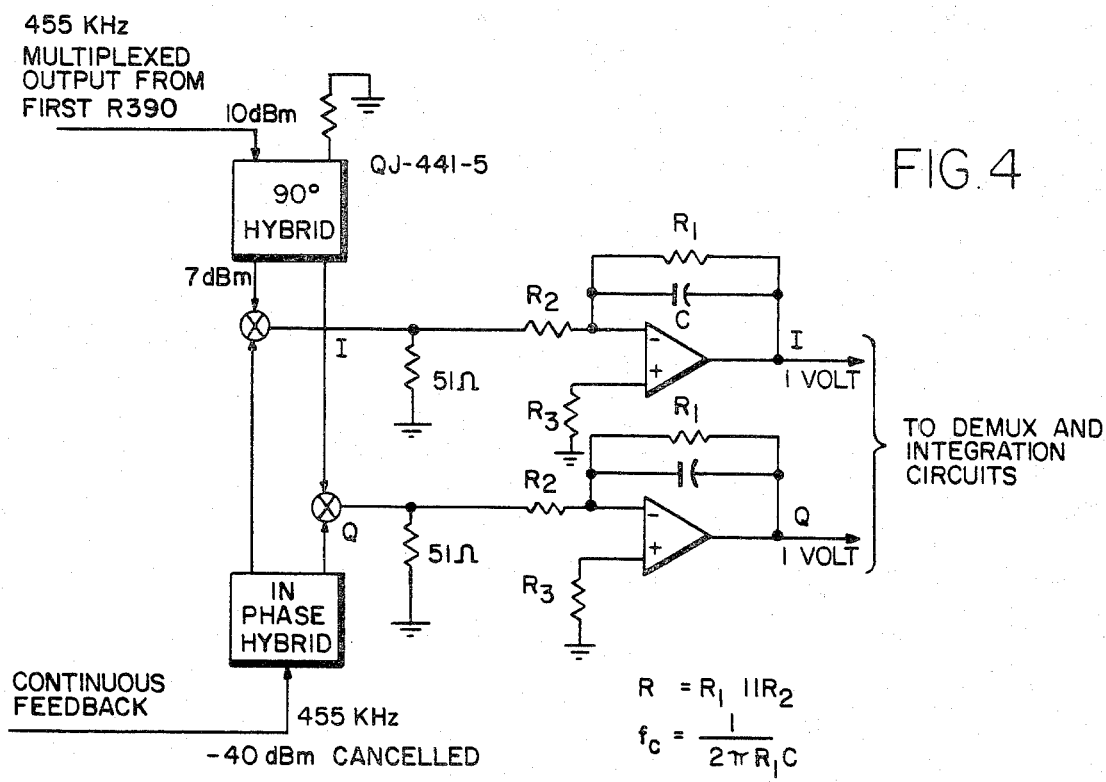
FIG. 4 is a schematic diagram of the multiplexes and video drives of the HF adaptive canceller of FIG. 2.

A schematic of the I/Q multipliers and video drivers is shown in FIG. 4. Correlation in an adaptive processing control loop implies the use of multiplication and integration networks. In the HF system, the multiplication operation is carried out by dividing the multiplexed reference signal at 455 kHz into I and Q components. The continuous feedback signal is divided into two in-phase components and then phase-detected down to video frequencies with the I and Q output of the first receiver used as reference signals. To ensure proper phase detection operation, the local oscillators of one receiver are locked to those of the other with, of course, each receiver tuned to the particular channel of interest.

The gains of the video drivers in FIG. 4 are selected to supply a 1-volt drive for a −40 dBm cancelled feedback signal. The capacitor C is selected to give some filtering at the harmonics of 455 kHz.

The nominal one volt outputs from the I and Q video drivers become the control system error signals after demultiplexing and integration. The error signal for each of the eight channels is sampled by an appropriate sample and hold module as shown in FIG. 5. The sample is acquired within 20 microseconds and held until the next appropriate sample time (approximately 2 milliseconds). The output of each sample and hold module drives an active low pass filter (integrator) network, designed to provide the desired closed loop weighting response. A driver stage amplifies the weight voltage to a maximum of 0.5 volts. The weight voltage drives the vector modulator through a series resistor which provides a maximum weight current drive of 10 mA.

The timing and control module generates the timing necessary to drive the 4-channel 2–30 MHz multiplex, and the eight sample and hold modules associated with the I and Q channels. The configuration is quite versatile; it allows the operator to select either channel 1, channels 1 & 2, channels 1, 2 & 3, or channels 1, 2, 3, & 4 for processing. The selection is dictated by the position of the multiplexing control switch located on the front panel and is analogous to operating with from one to four control loops.

FIG. 6 illustrates the flexibility built into the timing and control module. FIG. 6(a) shows the timing selections available for four channel (full) 2–30 MHz multiplexing. The time duration of each of the four channels may be selected as either 500 or 750 s. In addition, a 250 s dead time may be inserted between the samples as shown in FIG. 6. When the dead time is inserted, the sampling rate is "slow"; when it is not inserted, the rate is "fast". Both states are selectable by a front panel toggle switch.

Control switches are also available such that each of the three non-full multiplexing modes (1, 1-2, 1-2-3) may be either run continuously or CYCLED. The continuous mode essentially increases the data rate when additional time slots are available. For example, FIG. 6(b) illustrates the continuous pattern for channels 1 and 2, in which the f pattern becomes (1-2-1-2-1). In the CYCLED two-channel case of FIG. 2-15(c), the pattern becomes (1-2-Blank-Blank-1-2).

Referring now to FIG. 7, there is illustrated thereby the specific circuit components that give effect to the invention. They comprise antenna elements 9, preselector 10, multiplex switch 11, reference receiver 12, correlator 13, de-multiplexers 14, 15, integrators 18, 19, automatic gain control circuit 17, receiver 16, and summing means 20-23.

As indicated above, an adaptive antenna system that operates in a wide dynamic range environment requires an automatic gain control system in the reference and main channel receiver paths in order to maintain a stable adaptive loop gain at all signal input levels. In order to accomplish this, it is necessary that the main channel receiver (feedback path of the adaptive control system) have constant gain over the cancellation range. The approach used by the invention is shown by the block diagram of FIG. 7.

AGC voltage developed in the reference channel receiver 12 is applied to the main channel receiver 16 and sets its gain to the same value as the reference channel. The output level of the main channel receiver 16 is dependent on the level of the desired signal (uncancelled) which can vary over approximately a 40 dB range. When interference is present larger than the desired signal, the reference channel receiver does not respond to this variation. In order to restore the desired signal level to that required for normal listening independent AGC circuit 17 is used at the main channel receiver 16 output which automatically maintains constant level output to the speaker terminals.

While the invention has been described in terms of its preferred embodiment, it is understood that the words which have been used are words of description rather than words of limitation and that changes within the purview of the appended claims may be made without departing from the scope and spirit of the invention in its broader aspects.

What is claimed is:

1. In a multiplexer/adaptive array processor having a reference channel selector implemented by a first receiver and a feedback channel selector implemented by a second receiver the improvement residing in a coherent dual automatic gain control system, said coherent dual automatic gain control system comprising:
   a first gain control means controlling said first receiver, said first gain control means effecting automatic gain control of said first receiver over its entire dynamic range,
   a second gain control means controlling said second receiver being slaved to said first gain control means and setting the gain of said second receiver to the same value as the gain of said first receiver, and
   a third gain control means controlling the output of said second receiver to maintain a constant level output thereof.

* * * * *